United States Patent
Ueno

(10) Patent No.: US 8,996,326 B2
(45) Date of Patent: Mar. 31, 2015

(54) COUNTING DEVICE, PHYSICAL QUANTITY SENSOR, COUNTING METHOD, AND PHYSICAL QUANTITY MEASURING METHOD

(75) Inventor: Tatsuya Ueno, Tokyo (JP)

(73) Assignee: Azbil Corporation, Tokyo (JP)

( * ) Notice: Subject to any disclaimer, the term of this patent is extended or adjusted under 35 U.S.C. 154(b) by 434 days.

(21) Appl. No.: 12/825,812

(22) Filed: Jun. 29, 2010

(65) Prior Publication Data

US 2010/0332171 A1    Dec. 30, 2010

(30) Foreign Application Priority Data

Jun. 29, 2009  (JP) ................................ 2009-153487

(51) Int. Cl.
| | |
|---|---|
| *G01R 23/16* | (2006.01) |
| *G06F 19/00* | (2011.01) |
| *G01B 9/027* | (2006.01) |
| *G01S 17/32* | (2006.01) |
| *G01D 5/26* | (2006.01) |

(52) U.S. Cl.
CPC .............. *G01S 17/325* (2013.01); *G01D 5/266* (2013.01); *G01R 23/16* (2013.01)
USPC ............................... 702/71; 702/76; 356/450

(58) Field of Classification Search
USPC .......... 702/71, 76, 89, 106; 356/27, 498, 450
See application file for complete search history.

(56) References Cited

U.S. PATENT DOCUMENTS

| | | | |
|---|---|---|---|
| 2,333,245 A | | 11/1943 | Hansell |
| 4,066,999 A | * | 1/1978 | Spanjersberg ................ 382/160 |

(Continued)

FOREIGN PATENT DOCUMENTS

| | | |
|---|---|---|
| CN | 101203729 | 6/2008 |
| CN | 102192707 | 9/2011 |

(Continued)

OTHER PUBLICATIONS

Chinese Office Action, dated Jul. 26, 2013, which issued during the prosecution of Chinese Patent Application No. 201080065281.9.

(Continued)

*Primary Examiner* — Michael Nghiem
*Assistant Examiner* — Alexander Satanovsky
(74) *Attorney, Agent, or Firm* — Troutman Sanders LLP

(57) ABSTRACT

A tension/speed measuring device comprises a laser driver for driving the oscillation of a semiconductor laser, and a counter for counting interference waveforms included in the output of a photodiode for converting the output of the semiconductor laser into an electrical signal. The counter measures the periods of interference waveforms during a measuring interval, where a frequency distribution for the periods of the interference waveforms during the measuring interval is generated from the measuring results, where a class value wherein the product of the class value and the frequency is a maximum is used as a representative value D0 at the periods of the interference waveform, to calculate a total Ns of the frequencies of the classes that are less than 0.5 times the representative value T0 and to calculate a total $Nw_n$ of the frequencies of the classes that are equal to or greater than (n+0.5) times the representative value T0 and less than (n+1.5) times the representative value T0, to correct the counting results based on these frequencies Ns and Nwn.

4 Claims, 13 Drawing Sheets

(56) References Cited

U.S. PATENT DOCUMENTS

| | | | |
|---|---|---|---|
| 5,194,907 A | 3/1993 | Hayashi | |
| 5,867,536 A | 2/1999 | Lyons et al. | |
| 6,839,850 B1 * | 1/2005 | Campbell et al. | 726/23 |
| 6,872,931 B2 | 3/2005 | Liess et al. | |
| 7,684,957 B2 * | 3/2010 | Ueno | 702/158 |
| 7,911,593 B2 | 3/2011 | Ueno | |
| 7,961,302 B2 | 6/2011 | Ueno | |
| 8,446,574 B2 * | 5/2013 | Ueno | 356/27 |
| 8,494,796 B2 | 7/2013 | Ueno | |
| 2003/0201404 A1 | 10/2003 | Shiraishi | |
| 2009/0195771 A1 | 8/2009 | Ueno | |
| 2009/0257067 A1 | 10/2009 | Chapman | |
| 2010/0332171 A1 | 12/2010 | Ueno | |
| 2011/0032959 A1 | 2/2011 | Ueno | |
| 2011/0228254 A1 | 9/2011 | Ueno | |
| 2012/0290242 A1 * | 11/2012 | Ueno | 702/66 |
| 2013/0033696 A1 | 2/2013 | Ueno | |

FOREIGN PATENT DOCUMENTS

| | | |
|---|---|---|
| EP | 1978377 A2 | 10/2008 |
| EP | 2085789 A2 | 8/2009 |
| JP | 45-22386 | 7/1970 |
| JP | S63-255571 A | 10/1988 |
| JP | H02-287109 | 11/1990 |
| JP | H04-089507 | 3/1992 |
| JP | H10-90396 | 4/1998 |
| JP | H11-201722 | 7/1999 |
| JP | H11-287859 | 10/1999 |
| JP | 2004-513348 A | 4/2004 |
| JP | 2006-105669 | 4/2006 |
| JP | 2006-313080 A | 11/2006 |
| JP | 2008-175602 | 7/2008 |
| JP | 2009-47676 A | 3/2009 |
| JP | 2009-092461 | 4/2009 |

OTHER PUBLICATIONS

Extended European Search Report dated Nov. 4, 2011 which issued during prosecution of European Patent Application No. 11150186.2.
International Search Report dated Apr. 13, 2010 which issued during prosecution of International Application No. PCT/JP2010/053967.
Japanese Office Action dated Feb. 6, 2013, which issued during the prosecution of Japanese Patent Application No. 2008-288518.
Japanese Office Action dated Nov. 29, 2013, which issued during the prosecution of Japanese Patent Application No. 2008-288518.

* cited by examiner

COUNTING DEVICE, PHYSICAL QUANTITY SENSOR, COUNTING METHOD, AND PHYSICAL QUANTITY MEASURING METHOD

CROSS REFERENCE TO RELATED APPLICATIONS

The present application claims priority under 35 U.S.C. §119 to Japanese Patent Application No. 2009-153487, filed Jun. 29, 2009, which is incorporated herein by reference.

FIELD OF TECHNOLOGY

The present invention relates to a counter for counting a number of signals, and to an interference-type physical quantity sensor for calculating a physical quantity to be measured by measuring the number of interference waveforms using a counter.

BACKGROUND OF THE INVENTION

Conventionally there have been proposals for wavelength modulation-type laser measuring devices that use the self-coupling effect of semiconductor lasers. (See Japanese Unexamined Patent Application Publication 2006-313080 ("JP '080").) The structure of this laser measuring device is illustrated in FIG. 22. The laser measuring device in FIG. 22 includes a semiconductor laser 201 for emitting a laser beam at an object 210; a photodiode 202 for converting, into an electric signal, the optical output of the semiconductor laser 201; a lens 203 for focusing the beam from the semiconductor laser 201 and directing it toward the object 210, and for focusing the light that is reflected from the object 210 and allowing the light to be incident into the semiconductor laser 201; a laser driver 204 for repetitively alternating between a first oscillation interval wherein the oscillation wavelength of the semiconductor laser 201 increases continuously and a second oscillation interval wherein the oscillation wavelength decreases continuously; a transimpedance amplifier 205 for converting the output current of the photodiode 202 into a voltage, and amplifying the voltage; a signal extracting circuit 206 for differentiating twice an output voltage of the transimpedance amplifier 205; a counter 207 for counting the number of mode-hop pulses (hereinafter termed "MHP") included in the output voltage of the signal extracting circuit 206; a calculator for calculating the distance of the object 210 and the speed of the object 210; and a display 209 for displaying the calculation results of the calculator 208.

The laser driver 204 supplies, as a pumping current, to the semiconductor laser 201, a sawtooth wave driving current that repetitively rises and falls with a constant rate of change relative to time. Doing so causes the semiconductor laser 201 to be driven so as to repetitively alternate between a first oscillation interval, wherein the oscillation wavelength increases continuously at a steady rate of change, and a second oscillation interval, wherein the oscillation wavelength decreases continuously at a steady rate of change. FIG. 23 is a diagram illustrating the oscillation wavelength of the semiconductor laser 201 over time. In FIG. 23, P1 is the first oscillation interval, P2 is the second oscillation interval, λa is the minimum value for the oscillation wavelength in each of the intervals, λb is the maximum value for the oscillation wavelength in each of the intervals, and Tt is the period of the sawtooth wave.

The laser beam emitted from the semiconductor laser 201 is focused by the lens 203, to be incident on the object 210. The light that is reflected from the object 210 is focused by the lens 203, to be incident into the semiconductor laser 201. The photodiode 202 converts the optical power of the semiconductor laser 201 into an electric current. The transimpedance amplifier 205 converts the output current of the photodiode 202 into a voltage, and amplifies the voltage, where the signal extracting circuit 206 twice differentiates the output voltage of the transimpedance amplifier 205. The counter 207 counts the number of MHPs included in the output voltage of the signal extracting circuit 206 for the first oscillation interval P1 and the second oscillation interval P2. The calculator 208 calculates the distance to the object 210 and the speed of the object 210 based on the minimum oscillation wavelength λa and the maximum oscillation wavelength λb of the semiconductor laser 1, the number of MHPs during the first oscillation interval P1, and the number of MHPs during the second oscillation interval P2.

In the laser measuring device as set forth above, there are problems in that there would be errors in the numbers of MHPs counted by the counter due to, for example, noise, such as stray light, being counted as MHPs, or MHPs that are uncountable due to gaps in the signal, producing errors in the calculated physical quantities, such as distances.

Given this, the present inventor has proposed a counter that is able to exclude the effects of undercounting or overcounting at the time of counting by measuring the periods of the MHPs during the counting interval, deriving, from the measuring results, a frequency distribution of the periods during the counting interval, calculating a representative value for the period of the MHPs, from the frequency distribution, calculating, from the frequency distribution, a total Ns for the number of incidents of classes that are no more than a first specific multiple of the representative value and a total Nw of the frequencies of classes that are no less than a second specific multiple of the representative value, and then correcting the results of counting the MHPs based on these frequencies Ns and Nw. (See, Japanese Unexamined Patent Application Publication 2009-47676 ("JP '676").)

The counter disclosed in JP '676 is able to perform generally good corrections, insofar as it does not severely reduce the SN (signal-to-noise ratio).

However, the counter disclosed in JP '676 produces chattering, due to noise caused by higher frequencies rather than the MHPs, around the binarization threshold value in the signal inputted into the counter when the signal strength in measuring at a short distance is relatively strong as compared to the width of hysteresis. In some cases there would be many short-period signal or signals with periods of about half of the actual period for the MHP. In this case, a period that is shorter than the actual period of the MHP would become the representative value of the distribution of periods. This makes it impossible to properly correct the results of counting the MHPs, and thus there was a problem in that the results of counting the MHPs would be larger, for example, a few times as large, as the actual value.

SUMMARY OF THE INVENTION

Accordingly, it is an illustrative aspect of the present invention to provide a counter and counting method wherein counting errors can be corrected even when there is continuous high-frequency noise present in the input to the counter, and to provide a physical quantity sensor and physical quantity measuring method capable of improving the measurement accuracy of the physical quantity by correcting MHP counting error.

signal countersignal countersignal countersignal counter

According to one or more illustrative aspects of the present invention, there is provided a counter counting signals having a substantially single frequency when a physical quantity is constant, wherein the physical quantity has a linear relationship with the signals. The counter includes: a counter configured to count the number of input signals during given counting intervals; a period measuring unit configured to measure signal periods of the input signals during the counting interval each time each input signal is inputted; a frequency distribution generator configured to generate a frequency distribution of the signal periods during the counting interval, based on measurement results from the period measuring unit, wherein the frequency distribution represents a distribution of frequencies for each of class values; a representative value calculator configured to set one of the class values as a representative value for the signal periods, based on the frequency distribution, wherein the representative value has a maximum value obtained by multiplying the class value by the frequency corresponding to the class value; and a corrected value calculator configured to calculate, from the frequency distribution, a total number Ns and a total number $Nw_n$ so as to correct the number of the input signals counted by the counter, wherein Ns represents total of the frequencies of the class values that are less than 0.5 times the representative value, and $Nw_n$ represents total of the frequencies of class values that are equal to or greater than (n+0.5) and less than (n+1.5) times the representative value.

According to one or more illustrative aspects of the present invention, there is provided a physical quantity sensor including: a semiconductor laser that emits a laser beam to a measurement object; an emission frequency modulating unit that operates the semiconductor laser such that at least one of a first oscillation interval and a second oscillation interval repeatedly exists, wherein an oscillation wavelength continuously and monotonically increases during the first oscillation interval, and the oscillation wavelength continuously and monotonically decreases the second oscillation interval; a detector that detects an electric signal including interference waveforms, the interference waveforms being caused by the self-coupling effect of the laser light emitted from the semiconductor laser and return light from the measurement object; the counter that counts the number of the interference waveforms; and a calculator that calculates a physical quantity for the measurement object based on the number of the interference waveforms.

According to one or more illustrative aspects of the present invention, there is provided a counting method of counting signals having a substantially single frequency when a physical quantity is constant, wherein the physical quantity has a linear relationship with the signals. The method includes the steps of (a) counting the number of input signals during given counting intervals; (b) measuring signal periods of the input signals during the counting interval each time each input signal is inputted; (c) generating a frequency distribution of the signal periods during the counting interval, based on measurement results from the period measuring unit, wherein the frequency distribution represents a distribution of frequencies for each of class values; (d) setting one of the class values as a representative value for the signal periods, based on the frequency distribution, wherein the representative value has a maximum value obtained by multiplying the class value by the frequency corresponding to the class value; and (e) calculating, from the frequency distribution, a total number Ns and a total number $Nw_n$ so as to correct the number of the input signals counted by the counter, wherein Ns represents total of the frequencies of the class values that are less than 0.5 times the representative value, and $Nw_n$ represents total of the frequencies of class values that are equal to or greater than (n+0.5) and less than (n+1.5) times the representative value.

According to one or more illustrative aspects of the present invention, there is provided a method of measuring a physical quantity of a measurement object. The method includes the steps of (a) operating the semiconductor laser (1) that emits a laser beam to the measurement object, such that at least one of a first oscillation interval and a second oscillation interval repeatedly exists, wherein an oscillation wavelength continuously and monotonically increases during the first oscillation interval, and the oscillation wavelength continuously and monotonically decreases the second oscillation interval; (b) detecting an electric signal including interference waveforms, the interference waveforms being caused by the self-coupling effect of the laser light emitted from the semiconductor laser and return light from the measurement object; (c) counting the number of the interference waveforms, according to the counting method; and (d) calculating a physical quantity for the measurement object based on the number of the interference waveforms.

DETAILED DESCRIPTION OF THE INVENTION

Figure 1:
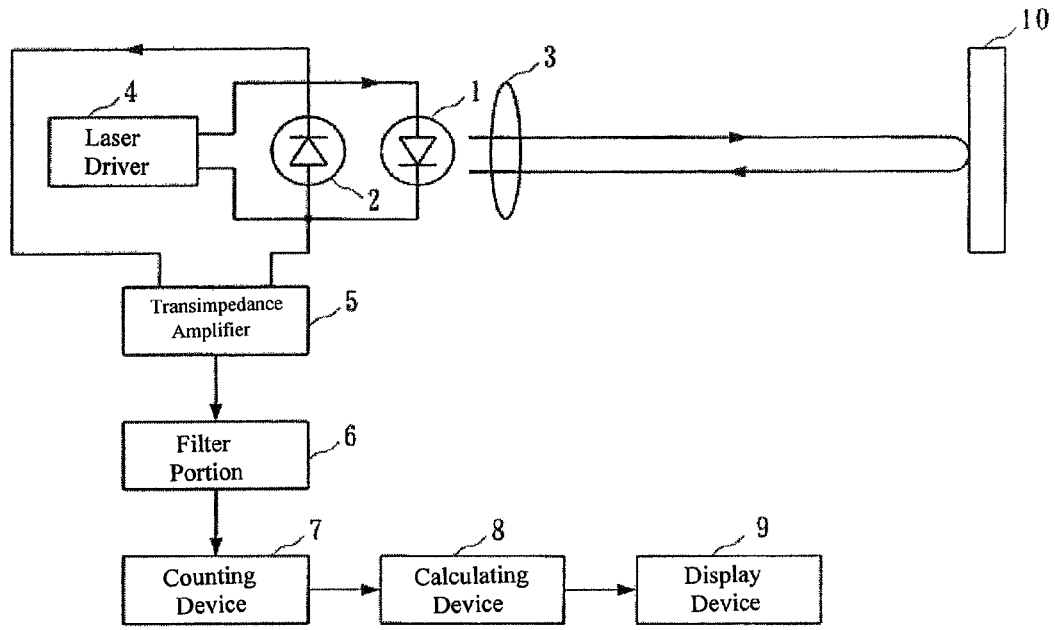
FIG. 1 is a block diagram illustrating the structure of a vibration frequency measuring device that is one example of a physical quantity sensor according to an embodiment of the present invention.

A form of embodiment of the present invention will be explained below in reference to the figures. FIG. 1 is a block diagram illustrating a structure for a vibration frequency measuring device that is one example of a physical quantity sensor relating to a form of embodiment according to the present invention.

The vibration frequency measuring device of FIG. 1 includes a semiconductor laser 1 for emitting a laser beam to the object 10 to be measured; a photodiode 2 for converting the optical output of the semiconductor laser 1 into an electric signal; a lens 3 for focusing and directing the beam from the semiconductor laser 1 and for focusing the light that is reflected from the object 10 to cause this light to be incident into the semiconductor laser 1; a laser driver 4 that serves as oscillation wavelength modulating unit for driving the semiconductor laser 1; a transimpedance amplifier 5 for converting into a voltage the current that is outputted from the photodiode 2, and for amplifying; a filter 6 for removing a carrier wave from the voltage that is the output of the transimpedance amplifier 5; a counter (i.e. counting device) 7 for counting the number of mode hop pulses (MHPs) that are self-coupled signals included in the voltage that is outputted from the filter 6; a calculator 8 that calculates the vibration frequency of the object 10 based on the results of counting by the counter 7; and a display 9 for displaying the results of the calculation by the calculator 8.

The photodiode 2 and the transimpedance amplifier 5 constitute a detector. For simplicity in the explanation, the below envisions the use of a semiconductor laser of a type that does not have the mode hopping phenomenon (e.g., VCSEL or DFB laser) for the semiconductor laser 1.

Figure 23:
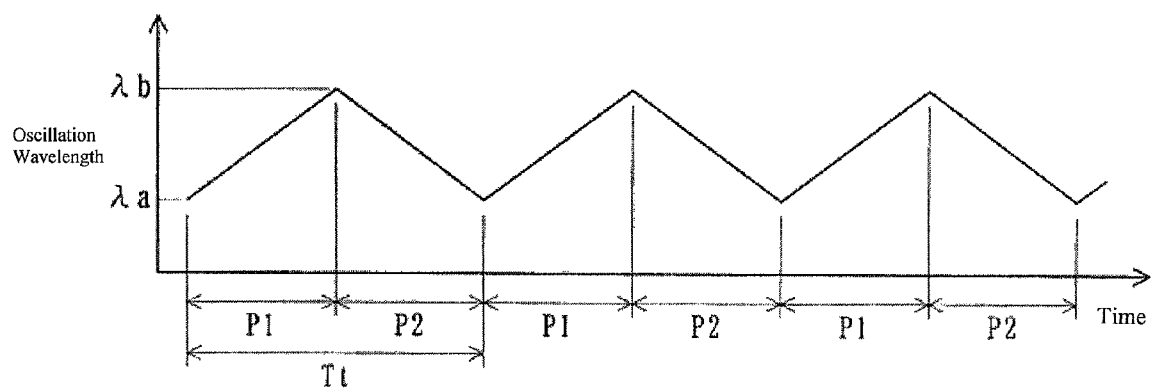
FIG. 23 is a diagram illustrating one example of changes in the oscillation wavelength of a semiconductor laser over time in the laser measuring device of FIG. 22.

The laser driver 4 provides, to the semiconductor laser 1, a sawtooth wave drive current, which repetitively rises and falls with a constant rate of change in respect to time, as the injection power supply. This causes the semiconductor laser 1 to be driven so as to repetitively alternate between a first oscillation the interval P1, wherein the oscillation wavelength increases continuously at a constant rate of change, proportional to the magnitude of the injection current, and a second oscillation interval P2, wherein the oscillation wavelength decreases continuously at a constant rate of change. At this time, the change in the oscillation wavelength of the semiconductor laser 1 over time is as illustrated in FIG. 23. In the present embodiment, the oscillation wavelength maximum value $\lambda b$ and the oscillation wavelength minimum value as are each always constant, so the difference $\lambda b - \lambda a$ is also always constant.

The laser beam that is emitted from the semiconductor laser 1 is focused by the lens 3 to be incident on the object 10. The beam that is reflected from the object 10 is focused by the lens 3 to be incident into the semiconductor laser 1. Note that the focusing by the lens 3 is not imperative. The photodiode 2 is disposed either within, or in the vicinity of, the semiconductor laser 1, and converts the optical power of the semiconductor laser 1 into an electric current. The transimpedance amplifier 5 converts the electric current outputted by the photodiode 2 into a voltage, and amplifies that voltage.

Figure 2:
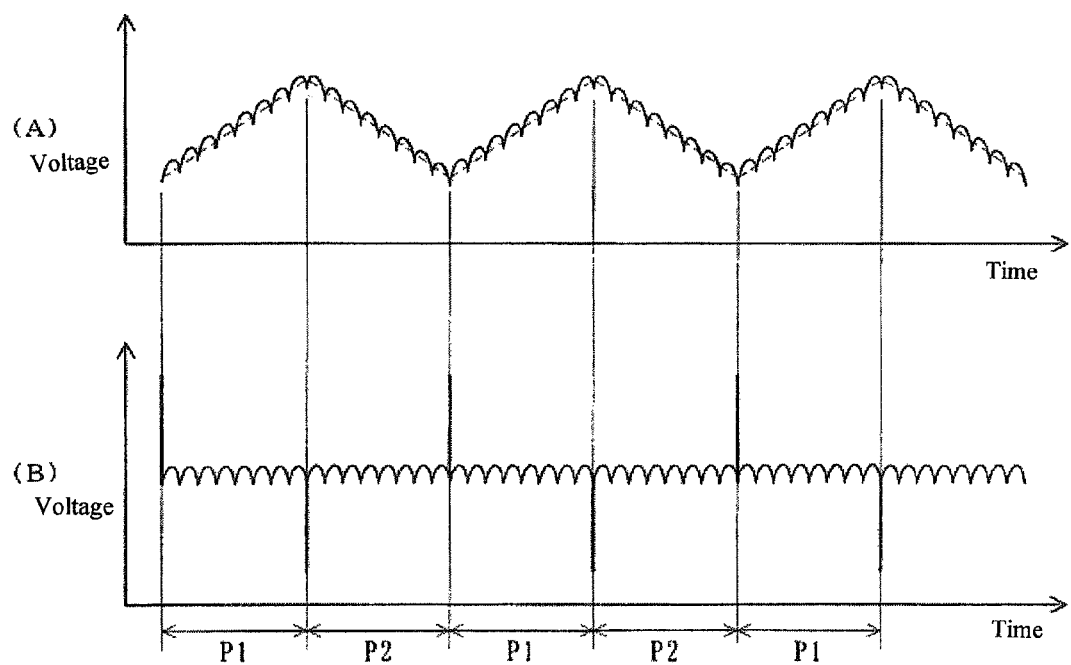
FIG. 2 is a waveform diagram illustrating schematically the output voltage waveform of a transimpedance amplifier and the output voltage waveform of a filter in the embodiment of the present invention.

The filter 6 has a function for extracting a superimposed signal from a modulated wave. FIG. 2A is a diagram illustrating schematically the output voltage waveform from the transimpedance amplifier 5, and FIG. 2B is a diagram illustrating schematically the output voltage waveform from the filter 6. These figures illustrate the process for removing the waveform (the carrier wave) that is emitted from the semiconductor laser 1 of FIGS. 2A and 2B from the waveform (the modulated wave) of FIG. 2A, which corresponds to the output from the photodiode 2, and the process for extracting the MHP waveform (the interference waveform) of FIG. 2B.

Figure 3:
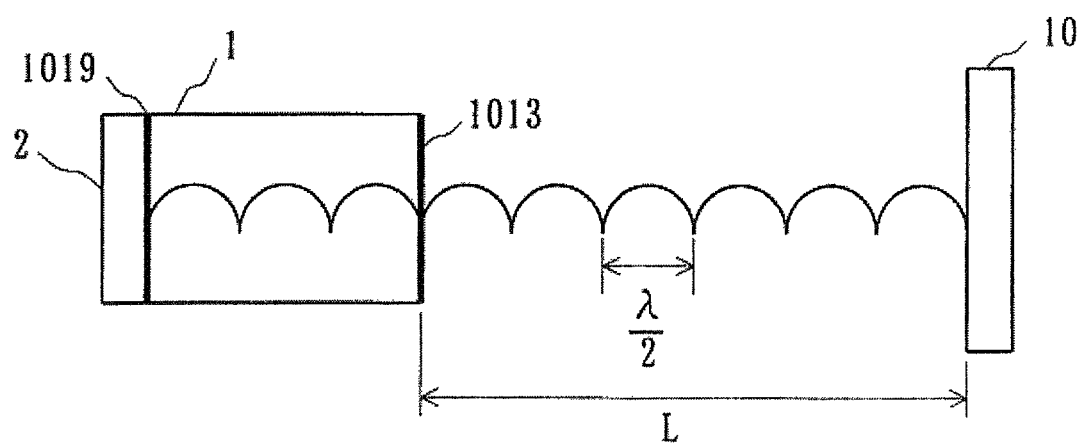
FIG. 3 is a diagram for explaining the mode hop pulses.

The MHP, which is the self-coupling signal, will be explained next. As illustrated in FIG. 3, when the distance from a mirror layer 1013 to the object 10 is defined as L and the oscillation wavelength of the laser is defined as $\lambda$, then when the resonant conditions set forth below are fulfilled, the reflected beam from the object 10 and the laser beam in the optical resonator of the semiconductor laser 1 will be mutually reinforcing, increasing slightly the laser power:

$$L = q\lambda/2 \tag{1}$$

In Equation (1), q is an integer. This phenomenon produces an amplifying effect, through the increase in the apparent reflectance within the resonator of the semiconductor laser 1, and can be adequately observed even when the scattered beam from the object 10 is extremely weak.

Figure 4:
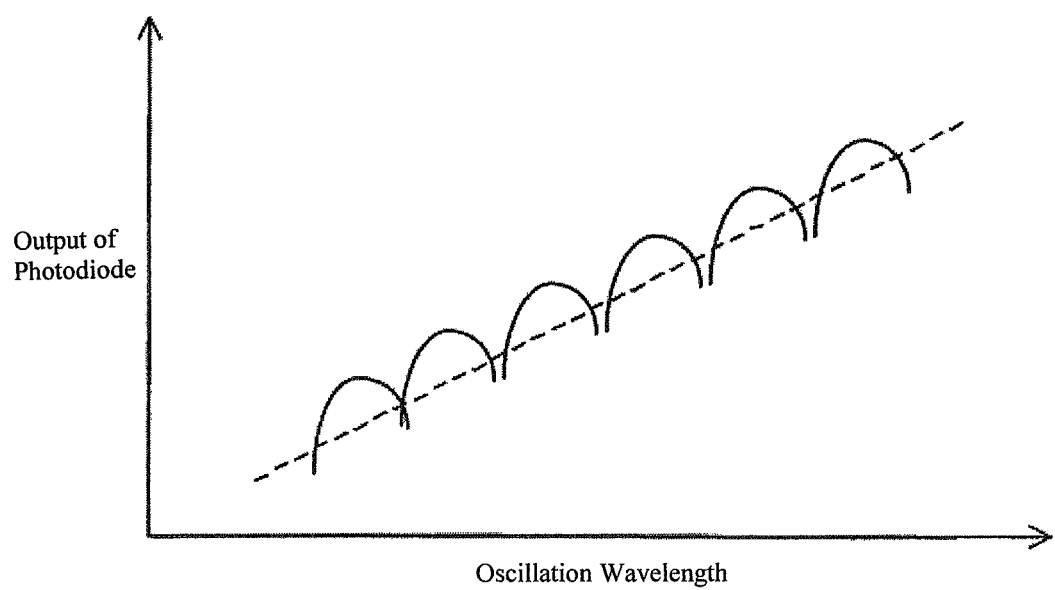
FIG. 4 is a diagram illustrating the relationship between the oscillation wavelength of the semiconductor laser and the output waveform of the photodiode.

FIG. 4 is a diagram illustrating the relationship between the waveform that is outputted from the photodiode 2 and the oscillation wavelength when the oscillation wavelength of the semiconductor laser 1 is changed at a constant rate. When the $L = q\lambda/2$ indicated by Equation (1) is fulfilled, then the phase difference between the reflected beam and the laser beam in the optical resonator will be 0° (the identical phase), where the reflected beam and the laser beam within the optical resonator will have maximum reinforcement, and when $L = q\lambda/2 + \lambda/4$, then the phase difference will be 180° (opposite phase), where the reflected beam and the laser beam within the optical resonator will maximally weaken each other. Because of this, when the oscillation wavelength of the semiconductor laser 1 is varied, places wherein the laser power becomes stronger and places wherein the laser power becomes weaker will repeatedly appear alternatingly, and when the laser power at this time is detected by the photodiode 2, a waveform with a stairstep shape with a constant period, as illustrated in FIG. 4, will be obtained. This waveform is typically referred to as interference fringes. This stairstep-shape waveform, or in other words, the interference fringes, has a one-to-one relationship with the MHPs. When the oscillation wavelength of the semiconductor laser 1 is varied over constant intervals, the number of MHPs will also vary in proportion to the measurement distance.

Figure 5:
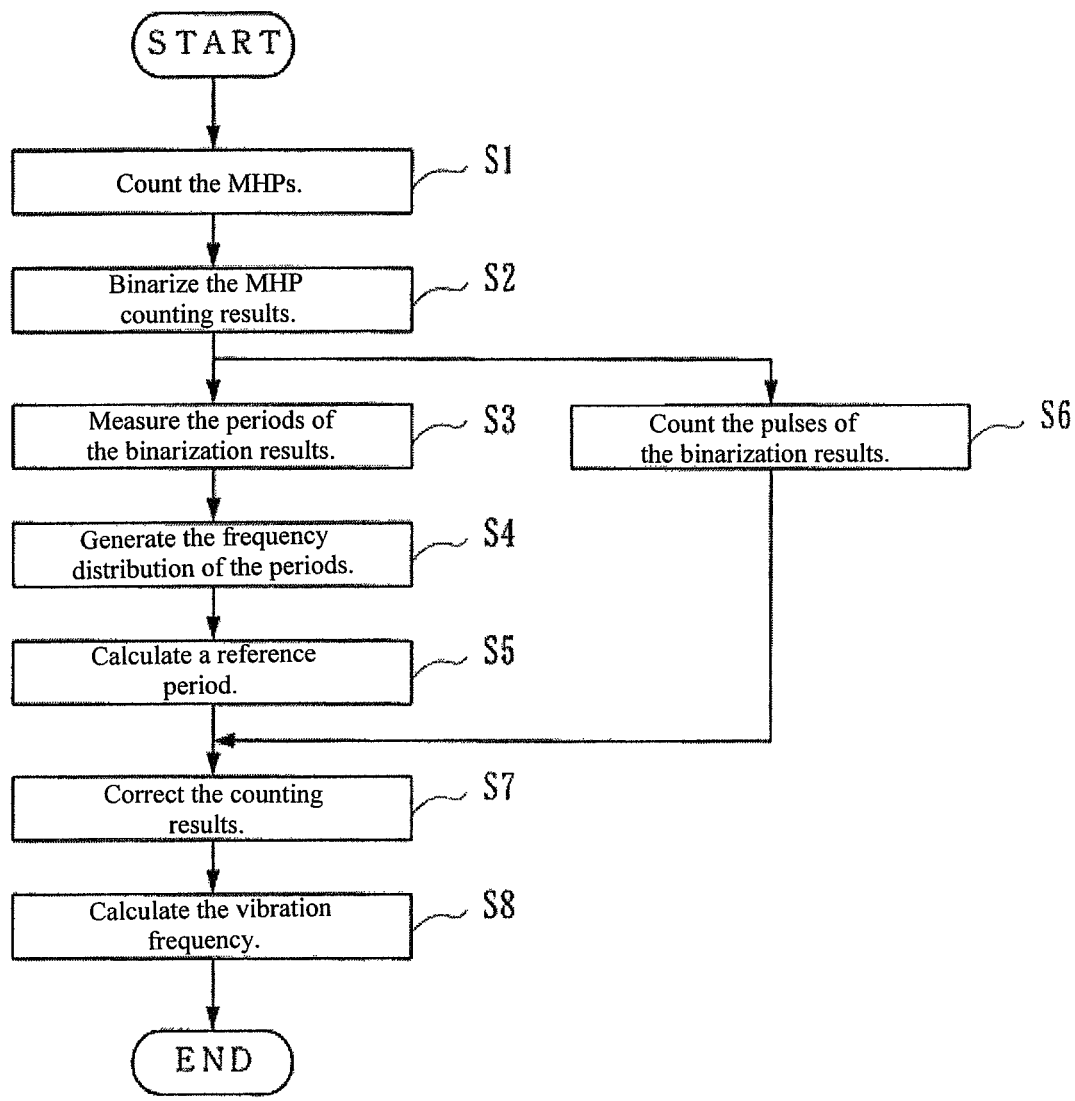
FIG. 5 is a flowchart illustrating the operation of the counter and the calculator according to the embodiment of the present invention.

The operation of the counter 7 and of the calculator 8 will be explained next. FIG. 5 is a flowchart illustrating the operations of the counter 7 and the calculator 8.

Figure 6:
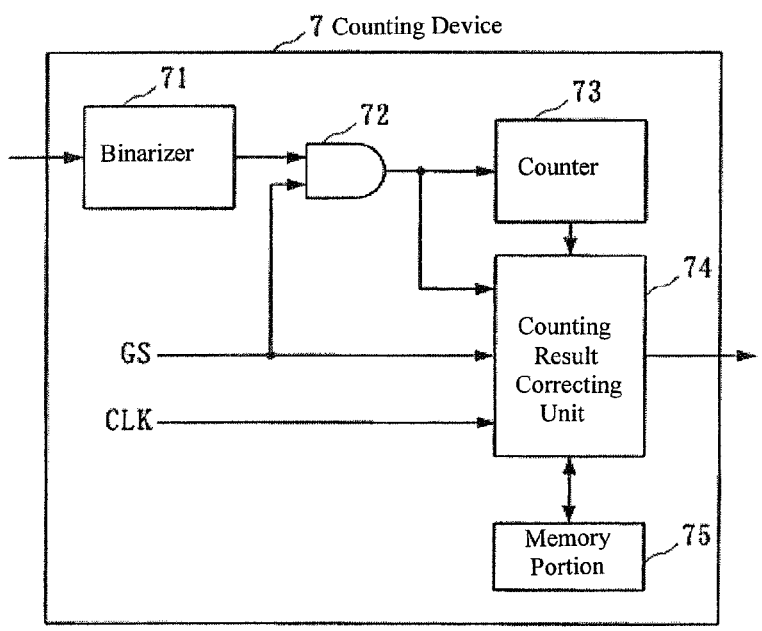
FIG. 6 is a block diagram illustrating one example of a structure for a counter according to the present invention.

Next, the counter 7 counts the number of MHPs included in the voltage outputted from the filter 6 separately for the first oscillation interval P1 and the second oscillation interval P2 (Step S1 in FIG. 5). FIG. 6 is a block diagram illustrating one example of a structure for the counter 7. The counter 7 includes a binarizer 71, AND circuit 72, a counter 73, a counting result correcting unit 74, and a memory 75. The signal counter includes the transimpedance amplifier 5, the filter 6, and the binarizer 71, AND gate 72, and counter 73 of the counter 7.

Figure 7:
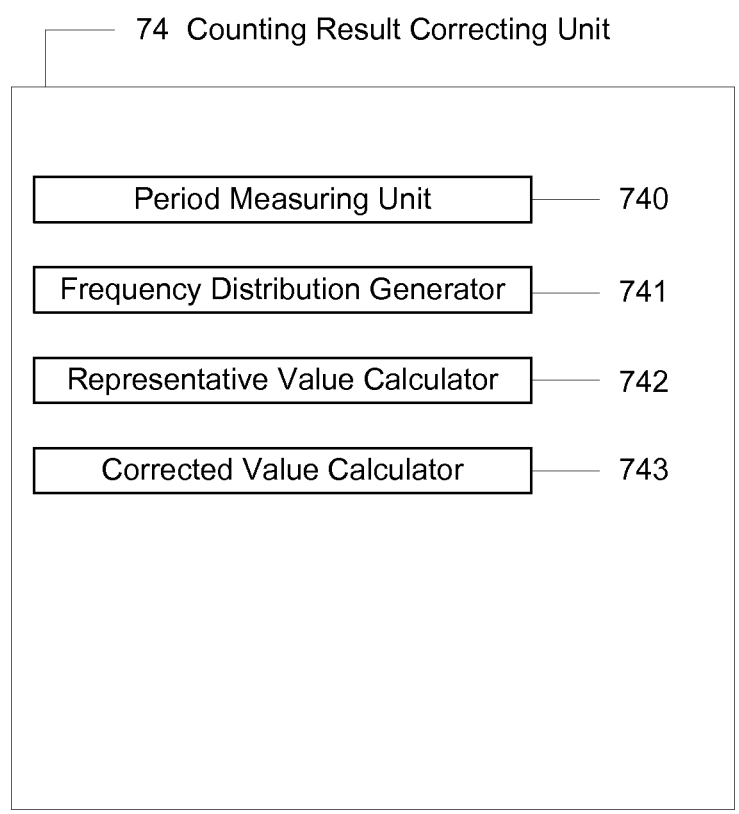
FIG. 7 is a block diagram illustrating one example of a structure for the counting result correcting unit of the counter in the present invention.

FIG. 7 is a block diagram illustrating one example of a structure for the counting result correcting unit 74. The counting result correcting unit 74 includes a period measuring unit 740, a frequency distribution generator 741, a representative value calculator 742, and a corrected value calculator 743.

FIG. 8A through FIG. 8F are diagrams for explaining the operation of the counter 7, wherein: FIG. 8A is a diagram illustrating schematically the waveform of the voltage that is outputted from the filter 6, or in other words, the MHP waveform; FIG. 8B is a diagram illustrating the output from the binarizer 71, corresponding to FIG. 8A; FIG. 8C is a diagram illustrating a gate signal GS that is inputted into the counter 7; FIG. 8D is a diagram illustrating the counting results from the counter 73, corresponding to FIG. 8B; FIG. 8E is a diagram illustrating a clock signal CLK that is inputted into the counter 7; and FIG. 8F is a diagram illustrating the measuring results from the period measuring unit 740, corresponding to FIG. 8B.

Figure 8:
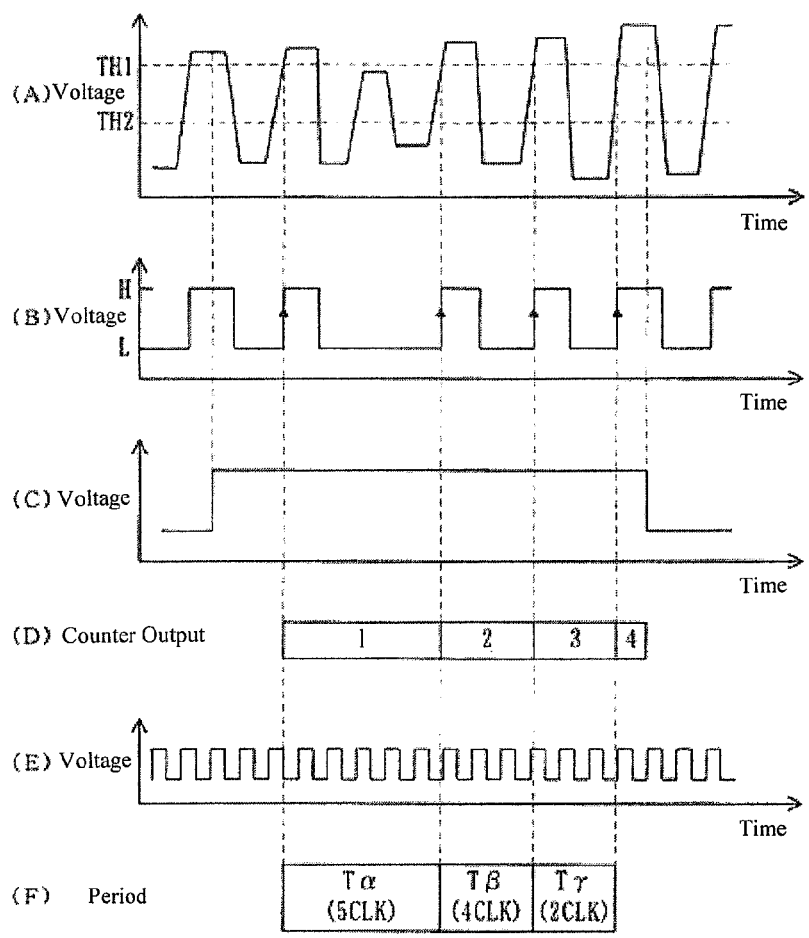
FIG. 8 is a diagram for explaining the operation of the counter according to the present invention.

First the binarizer 71 of the counter 7 determines whether the voltage outputted from the filter 6, illustrated in FIG. 8A, is at the high level (H) or the low level (L), and outputs the result of this determination, as in FIG. 8 (B). At this time, the binarizer 71 evaluates the voltage outputted from the filter 6 to be at the high level when it has risen to be at or above a threshold value TH1, and evaluates the voltage outputted from the filter 6 to be at the low level when it has fallen to be at or below a threshold value TH2 (wherein TH2<TH1) to thereby binarize the output of the filter 6.

The AND gate 72 outputs the result of a AND operation calculation between the output of the binarizer 71 and the gate signal GS as in FIG. 8C, and the counter 73 counts the rising edges of the output of the AND gate 72 (FIG. 8D). Here the gate signal GS is a signal that rises at the beginning of the counting interval (which, in the present form of embodiment, is the first oscillation interval P1 or the second oscillation interval P2), and falls at the end of the counting interval. Consequently, the counter 73 counts the number of rising edges in the output of the AND gate 72 (that is, the number of rising edges of the MHPs) during the counting interval.

On the other hand, the period measuring unit 740 of the counting result correcting unit 74 measures the period of the rising edges of the output of the AND gate 72 (that is, measures the period of the MHPs) each time there is a rising edge during the measuring interval. At this time, the period measuring unit 740 measures the period of the MHPs in units of the period of the clock signal CLK, illustrated in FIG. 8E. In the example in FIG. 8F, the period measuring unit 740 measures $T\alpha$, $T\beta$, and $T\gamma$, sequentially, as the periods for the MHPs. As is clear from FIG. 8E and FIG. 8F, the magnitudes of the periods $T\alpha$, $T\beta$, and $T\gamma$ are, respectively, five clocks, four clocks, and two clocks. The frequency of the clock signal CLK is caused to be sufficiently high when compared to the maximum frequency that can be assumed by the MHPs.

The memory 75 stores the results of the counting received from the counter 73 and the results of the measuring by the period measuring unit 740.

After the gate signal GS has fallen and the counting interval has ended, the frequency distribution generator 741 of the counting result correcting unit 74 generates, from the measuring results stored in the memory 75, a frequency distribution for the periods of the MHPs during the counting interval.

Following this, the representative value calculator 742 of the counting result correcting unit 74 calculates, from the frequency distribution generated by the frequency distribution generator 741, a representative value T0 for the periods of the MHPs. While in the counter disclosed in JP '676 the maximum value or the central value was used as the representative value for the periods of the MHPs, when chattering occurs continuously due to noise of a frequency that is higher than that of the MHPs in the signal that is inputted into the counter, when near to the binarization threshold value, the maximum value or central value is not suitable as the representative value for the period.

Given this, the representative value calculator 742 in the embodiment defines, as the representative value T0 for the periods of the MHPs, the class value wherein the product of the class value and the frequency is a maximum. Table 1 illustrates examples of numeric values for the frequency distribution and the products of the class values and the frequencies for the example numeric values.

TABLE 1

Examples of Numeric Values for a Frequency Distribution

| | Class Value | | | | | | | | | |
|---|---|---|---|---|---|---|---|---|---|---|
| | 1 | 2 | 3 | 4 | 5 | 6 | 7 | 8 | 9 | 10 |
| Frequency | 11 | 2 | 0 | 3 | 7 | 10 | 6 | 2 | 3 | 1 |
| Product | 11 | 4 | 0 | 12 | 35 | 60 | 42 | 16 | 27 | 10 |

In the example in Table 1, the maximum frequency value (class value) wherein the frequency is the largest was 1. In contrast, the class value wherein the product of the class value and the frequency was a maximum was 6, which is a value that is different from the maximum frequency value. The reason for defining, as the representative value T0, the class value wherein the product of the class value and the frequency is maximized will be explained below. The representative value calculator 742 performs this type of representative value T0 calculation each time a frequency distribution is generated by the frequency distribution generator 741.

The corrected value calculator 743 of the counting result correcting unit 74 calculates, from the frequency distribution generated by the frequency distribution generator 741, the total Ns of the frequencies of the classes wherein the periods are less than 0.5 times the representative value T0 and the total $Nw_n$ of the frequencies of the classes that are equal to or greater than (n+0.5) times the representative value T0 for the periods, and less than (n+1.5) times the representative value T0 (where n is a natural number that is no less than 1 and no more than $n_{max}$), and corrects the counting results of the counter 73 using the following equation:

Equation 2

$$N' = N - Ns + \sum_{n=1}^{n_{max}} (n \times Nw_n) \qquad (2)$$

$$n_{max} \leq \frac{T_{max}}{T0}$$

In Equation 2, N is the number of MHPs that is the result of the counting by the counter 73, N' is the counting result after the correction, and $T_{Max}$ is the maximum value that can be assumed by the period of the MHPs.

Figure 9:
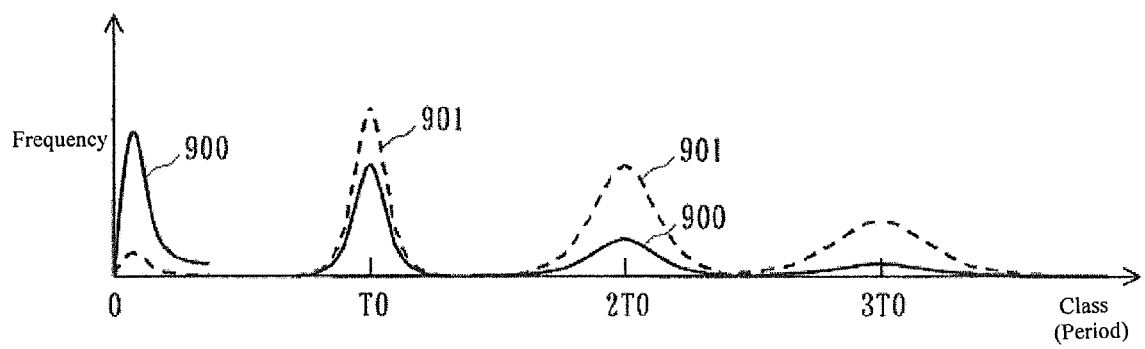
FIG. 9 is a diagram illustrating one example of a frequency distribution of the mode hopping periods.

FIG. 9 illustrates one example of a frequency distribution for the periods of the MHPs. In FIG. 9, 900 is the frequency distribution of the periods for the MHPs, and 901 indicates the values of the products of the class values and the frequencies (an occupation value indicating the time occupied by the signals in a given class during the counting interval).

In the example in FIG. 9, high-frequency noise occurs continuously in the signal that is inputted into the counter, and thus a frequency that is shorter than <0.5 T0 has the highest frequency value in the distribution. Consequently, if this high-frequency value were to be used as the representative value for the distribution, then the counting results for the MHPs would be corrected based on the period of the noise, which would result in performing the correction of the count in error. Given this, the counting results by the counter 73 are corrected based on the class value with the greatest amount of time, of the counting interval for counting the number of MHPs, occupied by the signals of that class, or in other words, where the product of the class value and the frequency is the highest. The above is the reason why the class value having the greatest product of the class value and the frequency is defined as the representative value T0.

Figure 10:
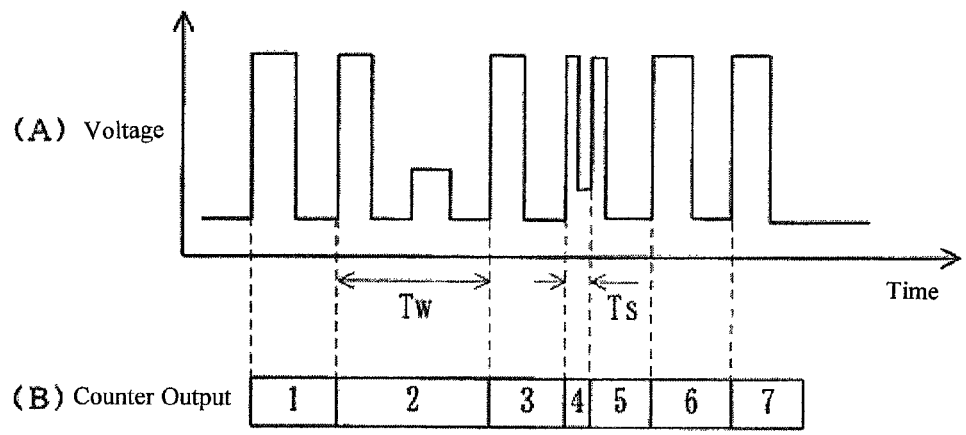
FIG. 10 is a diagram for explaining the principle for correcting the results of counting by the counter according to the present invention.

FIGS. 10A and 10B are diagrams for explaining the principle for correcting the counting results by the counter 73, where FIG. 10A is a diagram illustrating schematically the waveform of the voltage outputted by the filter 6, or in other words, of the waveform of the MHPs, and FIG. 10B is a diagram illustrating the counting results by the counter 73 corresponding to FIG. 10A.

Because of noises, there will be gaps in the MHP waveform, and there will be waveforms that should not be counted as signals, resulting in the production of a waveform at the output of the AND gate 72 wherein there are gaps, and signals that should not be counted, producing error in the counting results by the counter 73.

When there is a gap in the signal, the period Tw of the MHPs at the location wherein the gap occurred will be about twice the actual period. That is, when the period for the MHPs is greater than about twice the representative value T0, then it can be determined that a gap occurred in the signal. Given this, the total Nw of the frequencies for the classes that are equal to or greater than the period Tw can be viewed as the number of times that the signal has been dropped, making it possible to correct for the dropped signals by adding this Nw to the counting results N of the counter 73.

Additionally, the period Ts that is the shorter of the two MHPs at a location wherein what is actually a single MHP has been split into two by noise will be a period that is shorter than about 0.5 times the actual period. That is, in the case wherein the MHP period is less than 0.5 times the representative value T0, it can be determined that the signal has been overcounted.

Given this, the total Ns of the frequencies for the classes that are less than the period Ts can be viewed as the number of times that the signal was overcounted, making it possible to correct the noise that was counted in error, through subtracting this Ns from the counting results N of the counter 73.

The above is the principle for correcting the counting results, shown in Equation (2). Note that in the present embodiment Tw is no less than (n+0.5) times the representative value T0 and less than (n+1.5) times the representative value T0, rather than being a value that is twice the representative value T0, and the reason for this is disclosed in JP '676.

The counter 7 performs the process described above for the first oscillation interval P1 and the second oscillation interval P2 separately.

Figure 11:
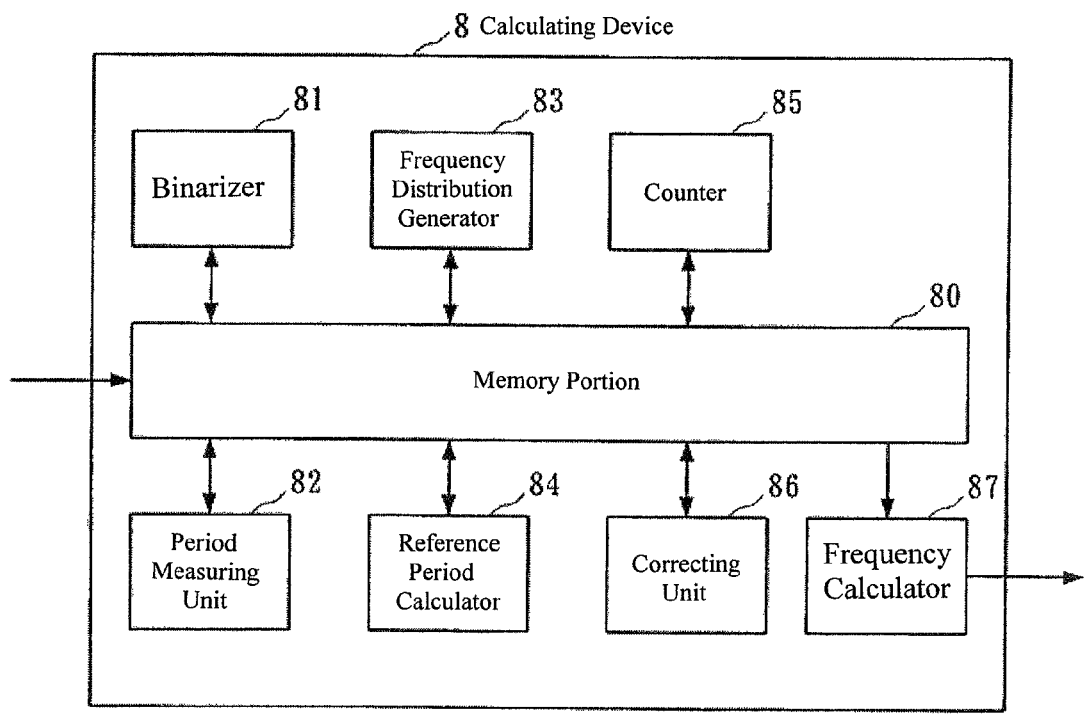
FIG. 11 is a block diagram illustrating one example of a structure for a calculator in the form of embodiment according to the present invention.

Next, the calculator 8 calculates the vibration frequency of the object 10 based on the number of MHPs counted by the counter 7. FIG. 11 is a block diagram illustrating one example of a structure for the calculator 8. The counter 8 is structured from: a memory 80 for storing, for example, the counting results by the counter 7; a binarizer 81 for binarizing the counting results of the counter 7; a period measuring unit 82 for measuring the period of the binarized output that is outputted from the binarizer 81; a frequency distribution generator 83 for generating the frequency distribution of the periods of the binarized output; a reference period calculator 84 for calculating a reference period that is the representative value of the distribution of the periods of the binarized output; a counter 85 counting the number of pulses of the binarized output; a correcting unit 86 for correcting the counting results of the counter 85; and a frequency calculator 87 for calculating the vibration frequency of the object 10 based on the corrected counting results.

Figure 12:
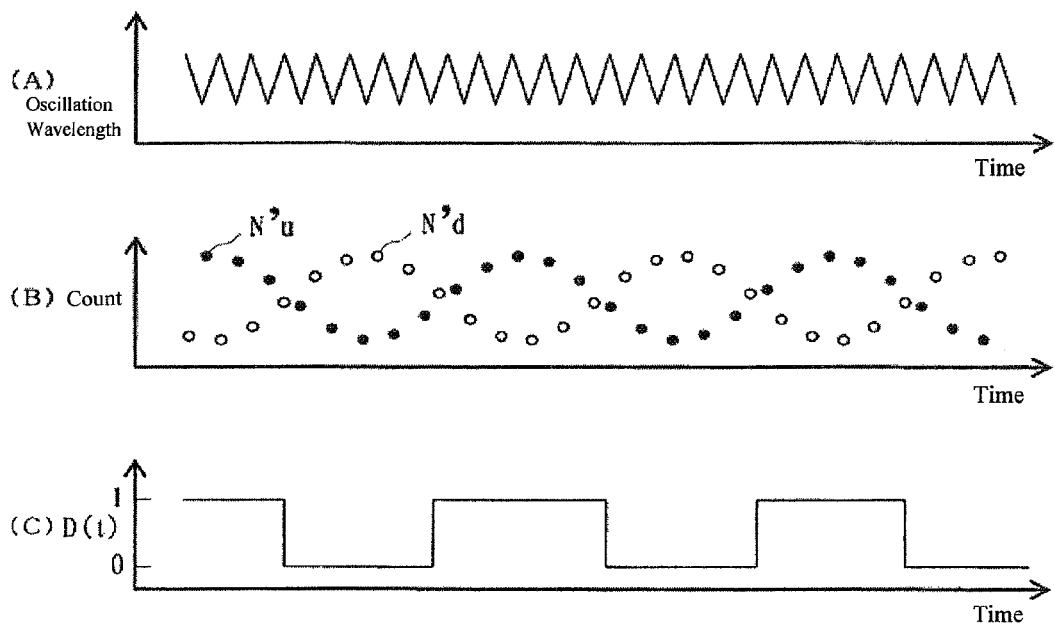
FIG. 12 is a diagram for explaining the operation of the binarizer in the calculator in according to the present invention.

The counting result by the counter 7 is stored in the memory 80 of the calculator 8. The binarizer 81 of the calculator 8 binarizes the counting result of the counter 7, stored in the memory 80 (Step S2 in FIG. 5). FIGS. 12A to 12C are diagrams for explaining the operation of the binarizer 81, where FIG. 12A is a diagram illustrating the changes in the oscillation wavelength of the semiconductor laser 1 over time, FIG. 12B is a diagram illustrating the changes in the counting results of the counter 7 over time, and FIG. 12C is a diagram illustrating the output D(t) of the binarizer 81. In FIG. 12 (B), N'u is the counting result in the first oscillation interval P1 and N'd is the counting result in the second oscillation interval P2.

The binarizer 81 compares the magnitudes of the counting results N'u and N'd of two oscillation intervals P1 and P2 that are temporally contiguous, to binarize the counting results. Specifically, the binarizer 81 executes the following formulas:

If $N'u(t) \geq N'd(t-1)$ then $D(t)=1$ \hfill (3)

If $N'u(t) < N'd(t-1)$ then $D(t)=0$ \hfill (4)

If $N'd(t) \leq N'u(t-1)$ then $D(t)=1$ \hfill (5)

If $N'd(t) > N'u(t-1)$ then $D(t)=0$ \hfill (6)

In Equations (3) through (6), (t) indicates that the count is for the MHPs counted as of the time mark t, where (t−1) indicates the number of MHPs counted as of the time mark one previous to the time mark t. Equations (3) and (4) are for the case wherein the counting result as of the time mark t is the counting result N'u for the first oscillation interval P1, and the immediately previous counting result is the counting result N'd for the second oscillation interval P2. In this case, the binarizer 81 sets the output D(t) as of the time mark t to "1"

(the high level) if the counting result N'u (t) as of the time mark t is greater than or equal to the immediately previous counting result N'd (t−1), and sets the output D(t) as of the time mark t to "0" (the low level) if the counting result N'u (t) as of the time mark t is less than the immediately previous counting result N'd (t−1).

Equation (5) and Equation (6) are for the case wherein the counting result as of the time mark t is the counting result N'd for the second oscillation interval P2, and the immediately previous counting result is the counting result N'u for the first oscillation interval P2. In this case, the binarizer 81 sets the output D(t) as of the time mark t to "1" if the counting result N'd (t) as of the time mark t is less than or equal to the immediately previous counting result N'u (t−1), and sets the output D(t) as of the time mark t to "0" if the counting result N'd (t) as of the time mark t is greater than the immediately previous counting result N'u (t−1).

The counting results of the counter 7 are binarized in this way. The output D(t) from the binarizer 81 are stored in the memory 80. The binarizer 81 performs the binarizing process as set forth above for each time mark wherein the number of MHPs is measured by the counter 7 (that is, for each oscillation interval).

The binarization of the counting results of the counter 7 means that the direction of dislocation of the object 10 is evaluated. That is, if the counting result N'u when the oscillation wavelength of the semiconductor laser 1 is increasing is equal to or greater than the counting result N'd when the oscillation wavelength is decreasing (D(t)=1), then the direction of movement of the object 10 is the direction approaching the semiconductor laser 1, and if the counting results N'u is less than the counting result N'd (D(t)=0), then the direction of movement of the object 10 is in the direction away from the semiconductor laser 1. Consequently, if it is possible to calculate the period of the binarized output, illustrated in FIG. 12 (C), then, fundamentally, it will be possible to calculate the vibration frequency of the object 10.

Figure 13:
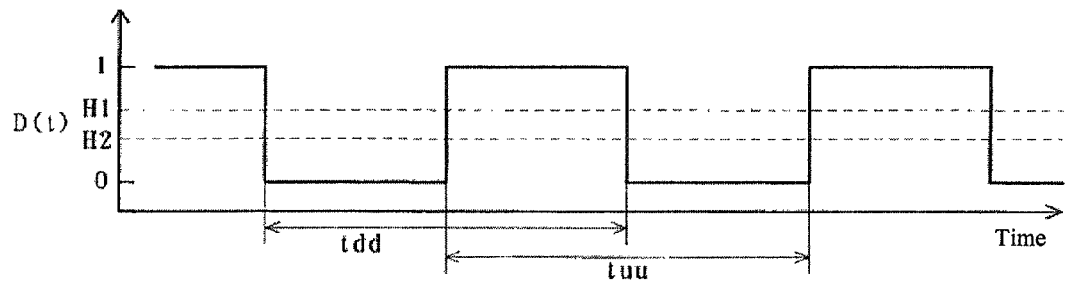
FIG. 13 is a diagram for explaining the operation of the period measuring unit in the calculator according to the present invention.

The period measuring unit 82 measures the period of the binarized output T (t) that is stored in the memory 80 (Step S3 in FIG. 5). FIG. 13 is a diagram for explaining the operation of the period measuring unit 82. In FIG. 13, H1 is a threshold value for detecting the rising edge of the binarized output D(t), and H2 is a threshold value for detecting the falling edge of the binarized output D(t).

The period measuring unit 82 detects the rising edge of the binarized output D(t) by comparing the binarized output D(t) that is stored in the memory 80 to the threshold value H1, to measure the period of the binarized output D(t) by measuring the time interval tuu from the rising edge of the binarized output D(t) until the next rising edge. The period measuring unit 82 performs this type of measurement each time there is a rising edge in the binarized output D(t).

Conversely, the period measuring unit 82 may detect the falling edge of the binarized output D(t) by comparing the binarized output D(t) that is stored in the memory 80 to the threshold value H2, to measure the period of the binarized output D(t) by measuring the time interval tdd from the falling edge of the binarized output D(t) until the next falling edge. The period measuring unit 82 may perform this type of measurement each time there is a falling edge in the binarized output D(t).

Figure 14:
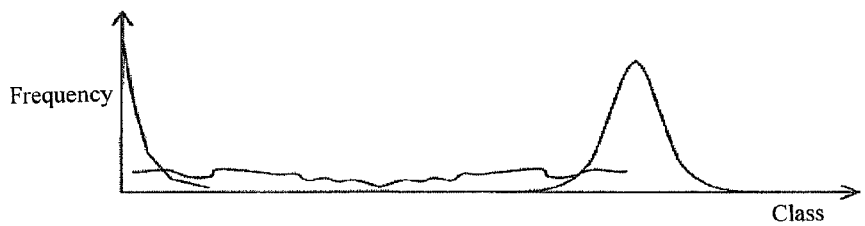
FIG. 14 is a diagram illustrating one example of a frequency distribution of the periods of the binarized output wherein the results of the counting by the counter have been binarized in the form of embodiment according to the present invention.

The measuring results by the period measuring unit 82 are stored in the memory 80. Following this, the frequency distribution generator 83 generates a frequency distribution for the periods in a constant time interval T (wherein T>Tt, for example, 100×Tt, or in other words, a time that is equal to the time for 100 sawtooth waves), from the measuring results by the period measuring unit 82 (Step S4 in FIG. 5). FIG. 14 is a diagram illustrating one example of a frequency distribution. The frequency distribution generated by the frequency distribution generator 83 is stored in the memory 80. The frequency distribution generator 83 performs the generation of the frequency distribution in this way with each time interval T.

Following this, the reference period calculator 84 calculates a reference period Tr, which is a representative value for the period of the binarized output D(t), from the frequency distribution generated by the frequency distribution generator 83 (Step S5 in FIG. 5). While typically the representative value for the period is the maximum frequency value or a central value, in the present embodiment the maximum frequency value or the central value is not applied as the representative value for the period. Given this, the reference period calculator 84 defines the class value with the maximum product of the class value and the frequency to be the reference period Tr. The reason for defining the class value having the maximum product of the class value and the frequency to be the reference period Tr is described below. The value of the calculated reference period Tr is stored in the memory 80. The reference period calculator 84 performs the calculation of the reference period Tr in this way each time the frequency distribution is generated by the frequency distribution generator 83.

On the other hand, the counter 85 operates in parallel with the period measuring unit 82 and the frequency distribution generator 83 so as to count the number Na of rising edges of the binarized output D(t) (that is, the number of "1" pulses of the binarized output D(t)) during the constant time interval T that is the same as the interval that was the subject for the generation of the frequency distribution by the frequency distribution generator 83 (Step S6 in FIG. 5). The counting result Na of the counter 85 is stored in the memory 80. The counter 85 performs this counting of the binarized output D(t) in this way for each T time interval.

The correcting unit 86 calculates, from the frequency distribution generated by the frequency distribution generator 83, the total Nsa of the frequencies for the classes that are equal to or less than 0.5 times the reference period Tr, and the total Nwa of the frequencies for the classes that are equal to or greater than 1.5 times the reference frequency Tr, and corrects the counting results Na of the counter 85 as per the following equation (Step S7 in FIG. 5):

$$Na'=Na-Nsa+Nwa \quad (7)$$

In Equation (7), Na is the counting result after the correction. These counting results Na' after correction are stored in the memory 80. The correcting unit 86 performs the correction as described above with each T time interval.

Figure 15:
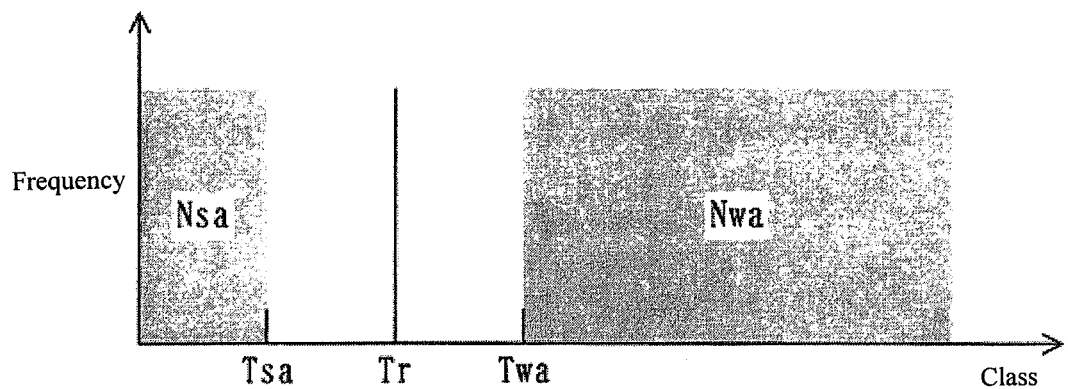
FIG. 15 is a diagram illustrating schematically the frequency used for correcting the results of counting by the counter in the calculator according to the present invention.

FIG. 15 is a diagram illustrating schematically the totals Nsa and Nwa of the frequencies. In FIG. 15, Tsa is the class value that is 0.5 times the reference period Tr, and Twa is the class value that is 1.5 times the reference period Tr. The classes in FIG. 15 refer, of course, to representative values for the periods. Note that the frequency distributions between the reference periods Tr and Tsa, and between the reference periods Tr and Twa are omitted in order to simplify the notation.

The principle for correcting the counting results, shown in Equation (7) is identical to the principle for correcting the counting results disclosed in JP '676 and the principle for correcting the counting results shown in Equation (2), and thus will be explained only briefly. While the period of the binarized output D(t) will vary depending on the vibrating frequency of the object 10, if the vibrating frequency of the object 10 is unchanging, then the pulses of the binarized output D(t) will appear with identical periods. However, because of noise there will be gaps in the MHP waveform, and there will be waveforms that should not be counted as signals, resulting in the occurrence of gaps also in the waveforms of the binarized output D(t) and waveforms that should not be counted as signals in the waveforms of the binarized output D(t), resulting in errors in the results of counting the pulses of the binarized output D(t).

When a signal is dropped, the period Twa of the binarized output D(t) at the location wherein the drop occurred will be about twice the actual period. That is, when the period of the binarized output D(t) is equal to or greater than about twice the reference period Tr, then it can be determined that a signal has been dropped. Given this, the total Nwa of the frequencies of the classes that are equal to or greater than the period Twa can be considered to be the number of signals that have been dropped, making it possible to correct the dropped signals by adding this Nwa to the counting results Na of the counter 85.

Additionally, the period Tsa of the binarized output D(t) at locations wherein the actual signal has been split by, for example, spike noise will become two signals, a signal that is shorter than 0.5 times the actual period and a signal that is longer than 0.5 times the actual period. That is, if the period of the binarized output D(t) is less than or equal to about 0.5 times the reference period Tr, then again it can be concluded that the signal has been overcounted. Given this, the total Nsa of the frequencies of the classes that are less than or equal to the period Tsa can be considered to be the number of signals that have been overcounted, and thus the noise that has been counted in error can be corrected through subtracting this Nsa from the counting results Na of the counter 85. The above is the principle for correcting the counting results, shown by Equation (7).

The frequency calculator 87 calculates the vibration frequency fsig of the object 10 as per the following equation, based on the counting results Na' after correction, calculated by the correcting unit 86 (Step S8 in FIG. 5):

$$fsig=Na'/T \qquad (8)$$

The display 9 displays the value for the vibration frequency fsig, calculated by the calculator 8.

As described above, the periods of the MHPs during the counting interval are measured, a frequency distribution for the periods of the MHPs during the counter interval is generated based on the measuring results, the class value wherein the product of the class value and the frequency is a maximum, in this frequency distribution, is defined as the representative value T0 for the periods of the MHPs, the total Ns of the frequencies of the classes that are less than 0.5 times the representative value T0 and the total $Nw_n$ of the frequencies of the classes that are equal to or greater than (n+0.5) times the representative value T0 and that are less than (n+1.5) times the representative value T0 are calculated, and the counting results of the counter 73 are corrected based on these frequencies Ns and $Nw_n$, to enable high-accuracy correction of the errors in the MHP counts, to thereby enable an improvement in the measurement accuracy of the vibration frequency of the object 10, even when noise of a higher frequency than the MHPs is occurring continuously in the signal inputted the counter.

Furthermore, the counting results for the MHPs are binarized by comparing the magnitudes of the counting results of temporally contiguous first and second oscillation intervals P1 and P2, generating frequency distributions for the periods over constant time intervals T by measuring the periods of the binarized outputs D(t), calculating, from the frequency distributions of the periods, a reference period Tr that is a representative value for the distribution of the periods of the binarized output D(t), counting the number of pulses of the binarized output D(t) over the intervals that are the constant time intervals T, calculating, from the frequency distribution, a total Nsa of the frequencies of the classes that are equal to or less than 0.5 times the reference period Tr and a total Nwa of the frequencies of the classes that are equal to or greater than 1.5 times the reference period Tr, and correcting the results of counting the pulses of the binarized output D(t) based on these frequencies Nsa and Nwa, thus enabling a correction to the counting error of the binarized output D(t), and enabling an increase in the accuracy of the measurement of the vibration frequency of the object 10.

The reason why the reference period calculator 84 defines, as the reference period, the class value wherein the product of the class value and the frequency is a maximum will be explained as follows.

In a self-coupling-type laser measuring device using wavelength modulation (sawtooth wave modulation in the present embodiment), the number of MHPs in each measuring interval will be the sum or the difference of a number of MHPs that is proportional to the distance from the object 10 and a number of MHPs that is proportional to the dislocation (speed) of the object 10 during the counting interval. The signals obtained from the counter may be divided into the following two types depending on the ratio of the maximum speed of vibration of the object 10 and the distance from the object 10, and the magnitude relationship with the rate of change of the wavelength of the semiconductor laser 1.

Figure 16:
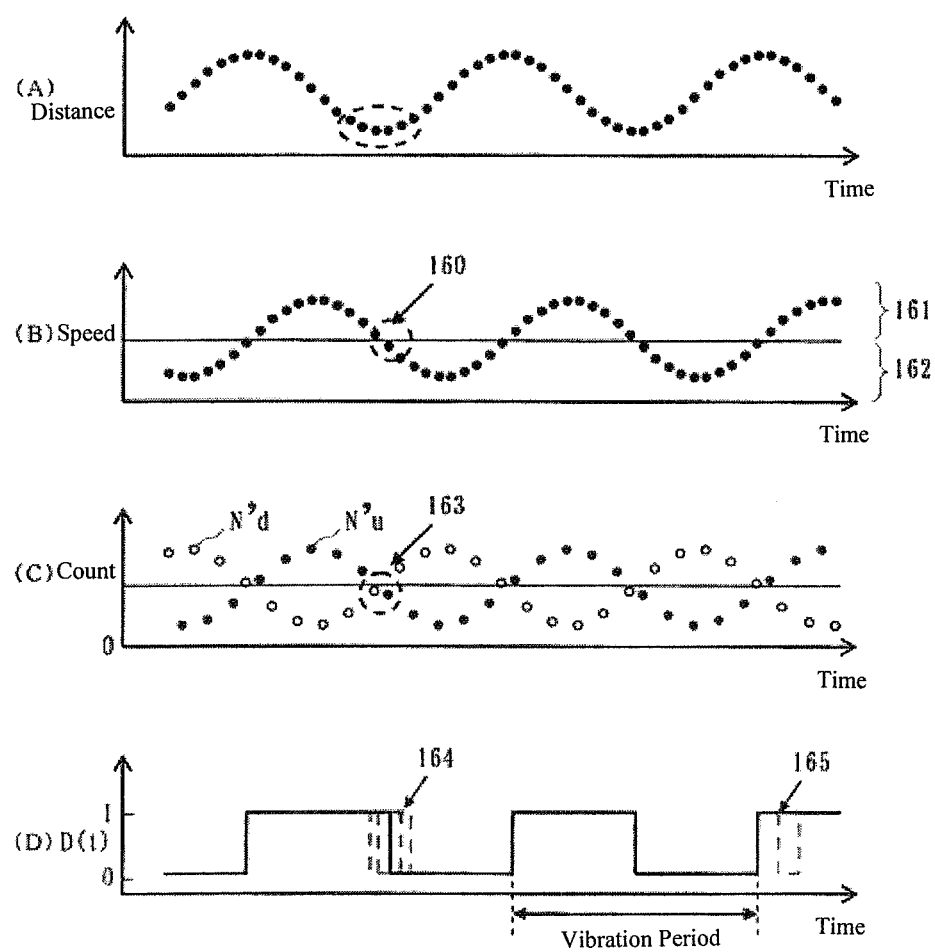
FIG. 16 is a diagram for explaining the signal obtained from the vibration frequency measuring device related to the form of embodiment according to the present invention when the ratio of the maximum speed of vibration of the object with respect to the distance of the object is smaller than the rate of change of the wavelength of the semiconductor laser.

The ratio of the maximum speed of vibration of the object 10 and the distance of the object 10 will be explained first for the case wherein it is less than the rate of change of the wavelength of the semiconductor laser 1. FIGS. 16A through FIG. 16D are diagrams for explaining the signals obtained by the vibration frequency measuring device, where FIG. 16A is a diagram illustrating the changes in distance of the object 10 over time, FIG. 16B is a diagram illustrating the changes in the speed of the object 10 over time, FIG. 16C is a diagram illustrating the changes in the counting results of the counter over time; and FIG. 16D is a diagram illustrating the binarized output D(t), wherein the counting results by the counter have been binarized. In FIG. 16B: 160 indicates a location wherein the speed is low; 161 indicates that the direction of movement of the object 10 is in the direction approaching the semiconductor laser 1; and 162 indicates that the direction of movement of the object 10 is in the direction away from the semiconductor laser 1. In the case wherein the ratio of the maximum speed of vibration of the object 10 and the distance to the object 10 is smaller than the rate of change of the wavelength of the semiconductor laser 1, the number of MHPs that is proportional to the distance from the object 10, will always be larger than the number of MHPs that is proportional to the dislocation (speed) of the object 10 during the measuring interval, and thus the absolute value of the difference between the measuring result N'u at the time wherein the oscillation wavelength of the semiconductor laser 1 is increasing and the measuring result N'd when the oscillation wavelength is decreasing will always be proportional to the dislocation of the object 10 in two measuring intervals (which, in the present form of embodiment, are the oscillation intervals P1 and P2). In this case, if a time series of N'u−N'd were to be plotted, the result would show the speed of vibration, with the direction approaching the semiconductor laser 1 being positive. Because of this, the sign of N'u−N'd will indicate the direction of movement of the object 10, making it possible to binarize the dislocation of the object 10 using this sign.

Figure 17:
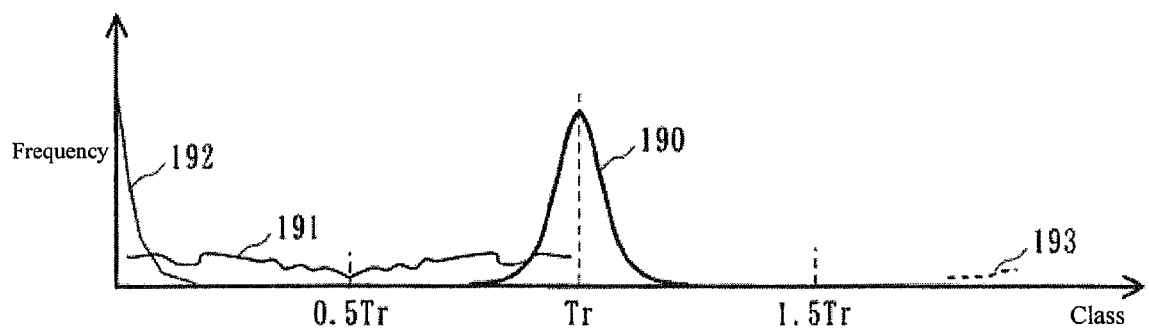
FIG. 17 is a diagram illustrating the frequency distribution of the periods, generated in accordance with the binarized output of FIG. 16.

At this time, the frequency distribution of the periods, generated by the frequency distribution generator 83, as illustrated in FIG. 17.

As illustrated in FIG. 16C, if white noise, arising from scattered light, or the like, were applied to a location 163 wherein the speed of the object 10 is low, then, the sign of the binarized output D(t) would assume a value that is opposite from the true value at a location 164 wherein the sign of the binarized output the D(t) switches. Additionally, when a spike noise due to, for example, scattered light is applied, then, as illustrated in FIG. 16D, the sign of the binarized output D(t) would be inverted locally at the location at 165.

Consequently, the frequency distribution of the periods generated by the frequency distribution generator 83, as illustrated in FIG. 17, would be the sum of a normal distribution at 190, centered on the reference period Tr, frequencies 191 due to the sign inversion caused by spike noise, and frequencies 192 due to sign inversion caused by white noise. Additionally, the frequency 193 of the signals dropped when binarization is performed will usually be absent insofar as there is no low-frequency noise, having a high speed, mixed in.

The case wherein the ratio of the maximum speed of vibration of the object 10 and the distance to the object 10 is larger than the rate of change of the wavelength of the semiconductor 1 will be explained next. FIG. 18A through FIG. 18D are diagrams for explaining the signals obtained by a vibration frequency measuring device according to the present form of embodiment in this case, where FIG. 18A is a diagram illustrating the change in distance to the object 10 over time, FIG. 18B is a diagram illustrating the change in speed of the object 10 over time, FIG. 18C is a diagram illustrating the change in the counting results by the counter 7 over time, and FIG. 18D is a diagram illustrating the binarized output D(t) by the binarizer 81. In FIG. 18B, 220 indicates a location wherein the speed is slow, 221 shows that the direction of motion of the object 10 is in the direction of approaching the semiconductor laser 1, and 222 shows the direction of motion of the object 10 is in the direction away from the semiconductor laser 1.

When the ratio of the maximum speed of vibration of the object 10 and the distance to the object 10 is larger than the rate of change of the wavelength of the semiconductor laser 1, then when near the maximum speed of the object 10, the number of MHPs that is proportional to the distance to the object 10 is smaller than the number of MHPs that is proportional to the dislocation (speed) of the object 10 during the counting interval, and thus there will be an interval wherein the difference between the counting result N'u when the oscillation wavelength of the semiconductor laser 1 is increasing and the counting result N'd when the oscillation wavelength is decreasing will be proportional to the dislocation of the object 10 during the two counting intervals (the oscillation intervals P1 and P2), and an interval wherein the sum of the counting results N'u and the counting results N'd is proportional to the dislocation of the object 10 over the two counting intervals.

Figure 18:
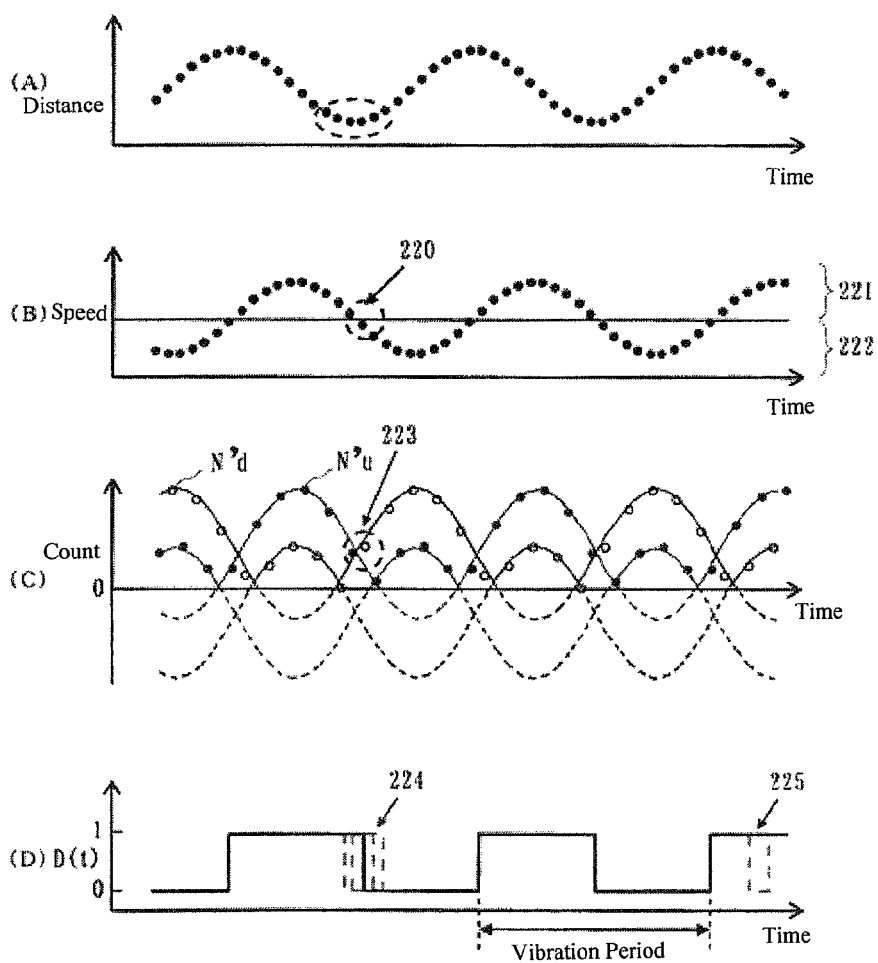
FIG. 18 is a diagram for explaining the signal obtained from the vibration frequency measuring device in the embodiment according to the present invention when the ratio of the maximum speed of vibration of the object with respect to the distance of the object is larger than the rate of change of the wavelength of the semiconductor laser.

In this case, the speed of vibration of the object 10 can be expressed by the composite of a graph wherein the N'u–N'd and N'u+N'd are plotted as shown in FIG. 18 (C. However, because the direction of the speed always matches the magnitude relationship between N'u and N'd, the sign of N'u–N'd indicates the direction of motion of the object 10, enabling the dislocation of the object 10 to the binarized by this sign.

As with the case wherein the ratio of the maximum speed of vibration of the object 10 and the distance to the object 10 is smaller than the rate of change of the wavelength of the semiconductor laser 1, in the location 223 wherein the speed of the object 10 is low, if white noise, caused, for example, by scattered light is applied, then at the location wherein the sign of the binarized output D(t) switches, there will be times wherein the sign of the binarized output D(t) has a value that is opposite from the actual value. Furthermore, when a spike noise, caused, for example, by scattered light is applied, the sign of the binarized output D(t) may reverse locally at a location 225, such as illustrated in FIG. 18 (D). At this time, the frequency distribution of the periods, generated by the frequency distribution generator 83, will be the same as in FIG. 17.

When correcting the binarized output D(t) wherein the dislocation of the object 10 has been binarized, as in the present form of embodiment, it is important to correct the high-frequency noise. The changes in signs in a short period due to high-frequency noise may exceed the frequency count for the periods for the actual vibration of the object 10, and so when the maximum frequency value or the central value is used as the representative value for the period, there may be a problem in that the correction may be applied in error based on a noise period that is shorter than the actual vibration period. Because of this, the counting result of the counter 85 is corrected using, as the reference period Tr, the class value with the largest time occupied by the signals of a given class, or in other words, with the largest product of the class value and the time, over the interval of the constant interval T for calculating the vibration frequency. This is the reason for using the class value that has the largest product of the class value and the frequency as the reference period Tr.

The representative value calculator 742 using, as the representative value T0, the class value wherein the product of the class value and the frequency is a maximum is for the same reason. That is, rather than using the highest frequency value or the central value as the representative value T0, when there is high-frequency noise it is better to use, as the representative value T0, the class value having the maximum time occupied by the signals of the class, in the counting interval.

Another form of embodiment according to the present invention will be explained next. While in the above embodiment, the time used for calculating the frequency distribution of the periods of the binarized output D(t) and for calculating the number of pulses of the binarized output D(t) was the constant time interval T, this time interval may instead be of a variable length.

Figure 19:
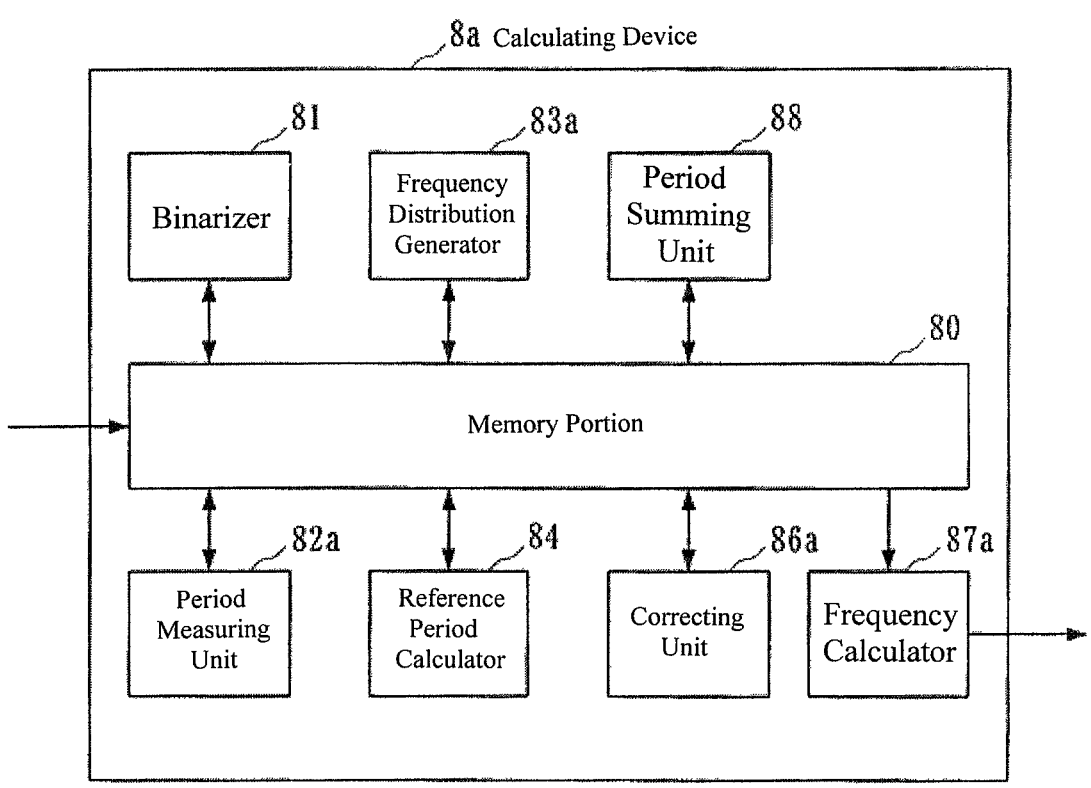
FIG. 19 is a block diagram illustrating one example of a structure of a calculator according to the present invention.

FIG. 19 is a block diagram illustrating one example of a structure for a calculator 8*a*. The calculator 8*a* is structured from a memory 80, a binarizer 81, a period measuring unit 82*a*, a frequency distribution generator 83*a*, a reference period calculator 84, a correcting unit 86*a*, a frequency calculator 87*a*, and a period summing unit 88.

Figure 20:
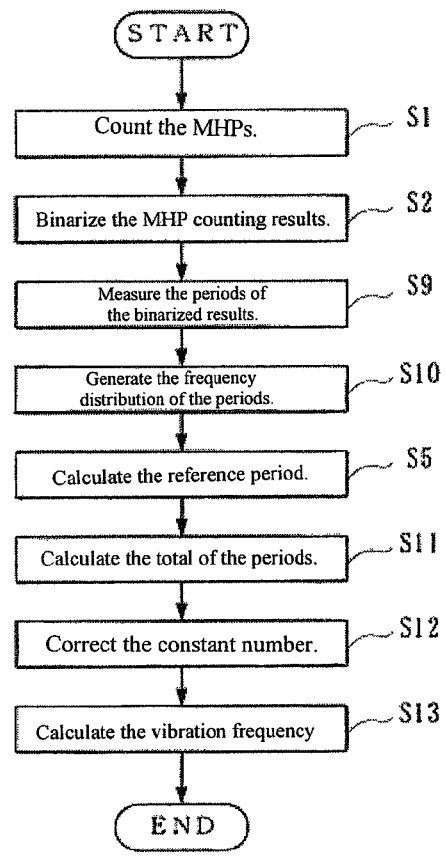
FIG. 20 is a flow chart illustrating the operation of the counter and of the calculator according to the present invention.

FIG. 20 is a flow chart illustrating the operation of the counter 7 and of the calculator 8*a* in the present embodiment. The operations of the semiconductor laser 1, the photodiode 2, the laser driver 4, the transimpedance amplifier 5, the filter 6, the counter 7, and the memory 80 and binarizer 81 of the calculator 8*a* are identical to those in the above embodiment.

The period measuring unit 82*a* measures the periods for a fixed number Na of pulses (where Na is a natural number that is no less than 2, for example, 100) of the binarized output D(t) stored in the memory 80 (Step S9 in FIG. 20). The method for calculating the periods of the binarized output D(t) may use, for example, the method explained in the form of embodiment. The measuring results by the period measuring unit 82*a* are stored in the memory 80. The period measuring unit 82*a* performs this type of measurement each time Na "1" pulses of the binarized output D(t) are produced.

The frequency distribution generator 83*a* generates the frequency distribution of the periods from the measuring results of the period measuring unit 82*a*, performed for the fixed number Na pulses of the binarized output D(t) (Step S10 in FIG. 20). The frequency distribution generated by the frequency distribution generator 83a is stored in the memory 80. The frequency distribution generator 83a performs the generation of the frequency distribution in this way each time Na "1" pulses of the binarized output D(t) are generated.

The operation of the reference period calculator 84 is similar to that in the form of embodiment (Step S5 in FIG. 20).

The period summing unit 88 calculates a total T of the periods measured for the fixed number Na of pulses of the binarized output D(t) from the measuring results of the period measuring unit 82a, stored in the memory 80 (Step S11 in FIG. 20). The calculated total T of the periods is stored in the memory 80.

The correcting unit 86a calculates, from the frequency distribution generated by the frequency distribution generator 83a, the total Ns of the frequencies of the classes that are equal to or less than 0.5 times the reference period Tr and calculates the total Nwa of the frequencies of classes that are equal to or greater than 1.5 times the reference period Tr, and corrects the constant number Na as per Equation (7) (Step S12 in FIG. 20). The value Na' after the correction is stored in the memory 80. The correcting unit 86a performs this correction each time Na "1" pulses of the binarized output D(t) are produced.

The frequency calculator 87a calculates the vibration frequency fsig of the object 10 based on the value Na' after correction, calculated by the correcting unit 86a, and on the total T of the period calculated by the period summing unit-period summing unit 88 as per Equation (8) (Step S13 in FIG. 20).

The other structures are identical to those above. In this way, the measurement accuracy of the vibration frequency of the object 10 can be improved even in the case wherein the calculator 8a is used instead of the calculator 8.

Because the time for calculating the frequency distribution of the periods of the binarized output D(t) and for calculating the number of pulses of the binarized output D(t) was fixed at the constant time interval T, in some cases the sum of the periods would not match the constant time interval T. Because of this there is the potential for errors to occur in the measurement of the vibration frequency of the object 10.

In contrast, in the present form of embodiment, the sum of the periods calculated by the period summing unit 88 is caused to be equal to the time interval T using Equation (8), thus not only enabling the same effects to be achieved as in the above embodiment, but also enabling a further improvement in the measurement accuracy of the vibration frequency.

Figure 21:
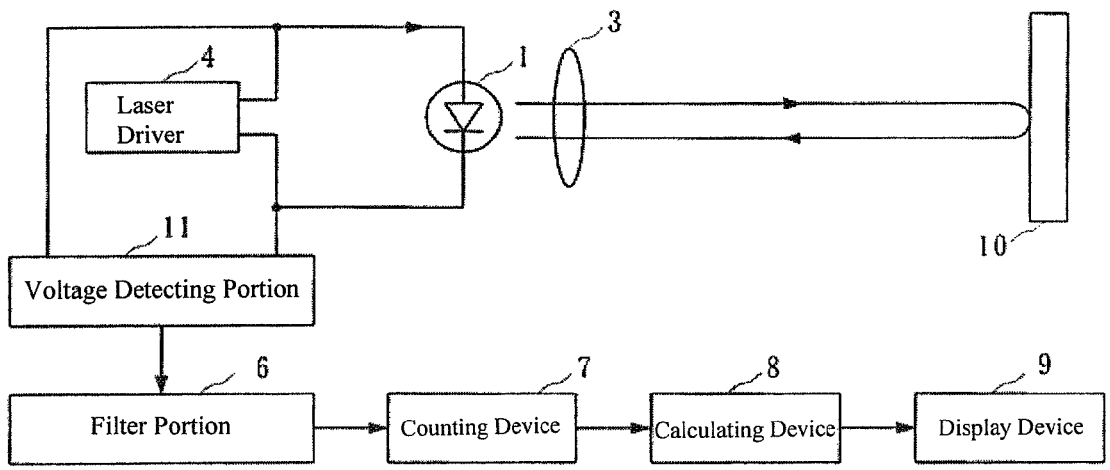
FIG. 21 is a block diagram illustrating the structure of a vibration frequency measuring device that is one example of a physical quantity sensor in another embodiment according to the present invention.
Figure 22:
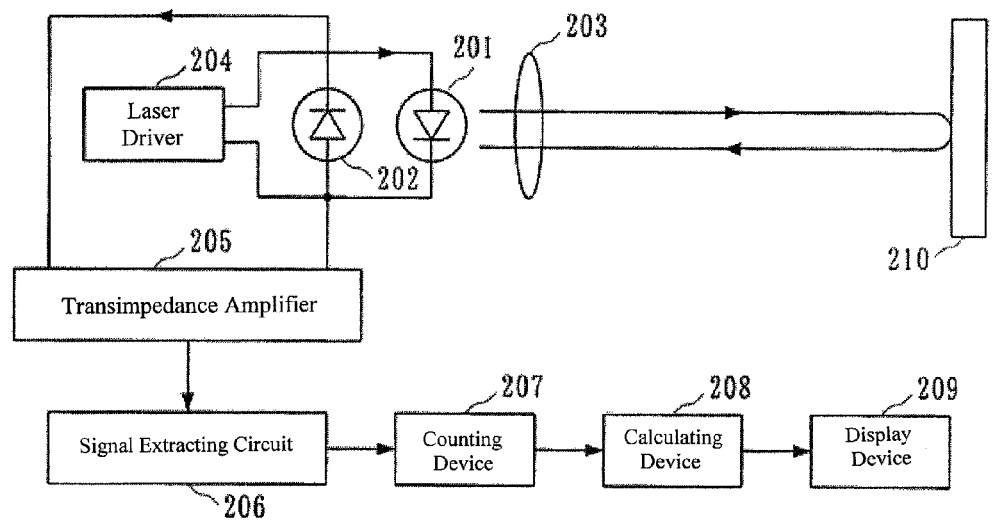
FIG. 22 is a block diagram illustrating a laser measuring device in the related art.

Another embodiment will be explained next. While in the above a photodiode 2 and a transimpedance amplifier 5 were used as detecting means for detecting an electric signal that includes the MHP waveforms, the MHP waveforms may be extracted without the use of a photodiode. FIG. 21 is a block diagram illustrating a structure for a vibration frequency measuring device that is one example of a physical quantity sensor related to a further embodiment, where the same codes are assigned in the same structure as in FIG. 1. The vibration frequency measuring device according to the present form of embodiment uses a voltage detector 11 as the detecting means, rather than the photodiode 2 and the transimpedance amplifier 5.

The voltage detector 11 detects and amplifies a voltage between the terminals of the semiconductor laser 1, or in other words, the voltage between the anode and the cathode. When there is interference between the laser beam emitted from the semiconductor laser 1 and the reflected beam from the object 10, the MHP waveforms appear in the voltage between the terminals of the semiconductor laser 1. Consequently, it is possible to extract the MHP waveform from the voltage between the terminals of the semiconductor laser 1.

The filter 6 removes the carrier wave from the voltage outputted from the voltage detector 11. The other structures of the vibration frequency measuring device are identical to those in the above forms of embodiment.

In this way, the present example of embodiment enables the extraction of the MHP waveform without the use of a photodiode, enabling a reduction in the part counts in the vibration frequency measuring device when compared to the first and second forms of embodiment, and thus enabling a reduction in the cost of the vibration frequency measuring device. Furthermore, because no photodiode is used, it is also possible to eliminate the effects of scattered light.

The driving current supplied to the semiconductor laser 1 from the laser driver 4 is controlled so as to be near the threshold value current for the laser oscillation. Doing so facilitates the extraction of the MHPs from the voltage between the terminals of the semiconductor laser 1.

Note that in the all forms of embodiment at least the counter 7 and the calculator 8 may be accomplished through a computer provided with, for example, a CPU, a storage device, and an interface, and through a program that controls of these hardware resources. A program for causing this type of computer to operate may be provided stored on a recording medium such as a flexible disk, a CD-ROM, a DVD-ROM, or a memory card. The CPU writes, to the memory device, a program that has been read in, and executes the processes explained in accordance with this program.

Note that while cases wherein the counter as set forth in the present invention is applied to a vibration frequency measuring device as explained is not limited thereto, but rather the counter according to the present invention may also be applied to other fields. A case wherein the measuring device according to the present invention is effective is a case wherein the number of signals that are subject to counting has a linear relationship with a specific physical quantity, wherein the signal has essentially a uniform frequency when the specific physical quantity is constant.

Additionally, the counter according to the present invention is also useful even when the signal does not have a uniform frequency, if the specific physical quantity has an adequately low-frequency when compared to the counting interval, such as, for example, when the spread of the period distribution is small, such as the speed of an applicable object vibrating at no more than 1/10 of the frequency.

Furthermore, while the explanations used a vibration frequency measuring device as an example of a physical quantity sensor, the present invention is not limited thereto, but may also be applied to other physical quantity sensors. That is, the tension on a physical object may be calculated from the counting results by the counter, or, as disclosed in JP '080, the distance to a physical object and the speed of the physical object may be calculated from the counting results of the counter. As is clear from a variety of different physical quantity is being calculated by the physical quantity sensor, the aforementioned specific physical quantity may or may not be identical to the physical quantity calculated by the physical quantity sensor.

The present invention can be applied to a counter for counting the number of signals, and to an interference-type physical quantity sensor for calculating a physical quantity to be measured by measuring a number of interference waveforms using a counter.

Constituent components disclosed in the aforementioned embodiments may be combined suitably to form various modifications. For example, some of all constituent components disclosed in one of the embodiments may be removed or the constituent components disclosed in different embodiments may be appropriately combined.

The invention claimed is:

1. A counter system counting signals having a substantially single frequency when a physical quantity is constant, wherein the physical quantity has a linear relationship with the signals, the counter system comprising:
 a counter counting the number of input signals during given counting intervals;
 a period measuring unit measuring signal periods of the input signals during the counting interval each time each input signal is inputted;
 a frequency distribution generator generating a frequency distribution of the signal periods during the counting interval, based on measurement results from the period measuring unit, wherein the frequency distribution represents a distribution of frequencies for each of class values, wherein a magnitude relation between the class values has a physical relation;
 a representative value calculator setting one of the class values as a representative value for the signal periods, based on the frequency distribution, wherein the representative value has a maximum value obtained by multiplying the class value by the frequency corresponding to the class value; and
 a corrected value calculator calculating, from the frequency distribution, a total number Ns and a total number $Nw_n$ so as to correct the number of the input signals counted by the counter, wherein Ns represents total of the frequencies of the class values that are less than 0.5 times the representative value, and $Nw_n$ represents total of the frequencies of class values that are equal to or greater than (n+0.5) and less than (n+1.5) times the representative value,
 wherein the corrected value calculator calculates the corrected number of the input signals N' based on the following expression:

$$N' = N - Ns + \sum_{n=1}^{n_{max}} (n \times Nw_n)$$

$$n_{max} \leq \frac{T_{max}}{T0}$$

wherein the number of the input signals counted by the counter is N, the representative value is T0, and a maximum value of the signal periods is TMax.

2. A physical quantity sensor comprising:
 a semiconductor laser emitting a laser beam to a measurement object;
 an emission frequency modulating unit operating the semiconductor laser such that at least one of a first oscillation interval and a second oscillation interval repeatedly exists, wherein an oscillation wavelength continuously and monotonically increases during the first oscillation interval, and the oscillation wavelength continuously and monotonically decreases the second oscillation interval;
 a detector detecting an electric signal including interference waveforms, the interference waveforms are caused by the self-coupling effect of the laser light emitted from the semiconductor laser and return light from the measurement object;
 the counter system of claim 1 counting the number of the interference waveforms; and
 a calculator calculating a physical quantity for the measurement object based on the number of the interference waveforms.

3. A counting method of counting signals having a substantially single frequency when a physical quantity is constant, wherein the physical quantity has a linear relationship with the signals, the method comprising the steps of:
 counting, with a counter, the number of input signals during given counting intervals;
 measuring, with a period measuring unit, signal periods of the input signals during the counting interval each time each input signal is inputted;
 generating, with a frequency distribution generator, a frequency distribution of the signal periods during the counting interval, based on measurement results from the period measuring unit, wherein the frequency distribution represents a distribution of frequencies for each of class values, wherein a magnitude relation between the class values has a physical relation;
 setting, with a frequency distribution generator, one of the class values as a representative value for the signal periods, based on the frequency distribution, wherein the representative value has a maximum value obtained by multiplying the class value by the frequency corresponding to the class value; and
 calculating, from the frequency distribution, a total number Ns and a total number Nwn so as to correct the number of the input signals counted by the counter, wherein Ns represents total of the frequencies of the class values that are less than 0.5 times the representative value, and Nwn represents total of the frequencies of class values that are equal to or greater than (n+0.5) and less than (n+1.5) times the representative value,
 wherein calculating step comprises the step of calculating the corrected number of the input signals N' based on the following expression:

$$N' = N - Ns + \sum_{n=1}^{n_{max}} (n \times Nw_n)$$

$$n_{max} \leq \frac{T_{max}}{T0}$$

wherein the number of the input signals counted by the counter is N, the representative value is T0, and a maximum value of the signal periods is TMax.

4. A method of measuring a physical quantity of a measurement object, the method comprising the steps of:
 emitting a laser beam to the measurement object, with a semiconductor laser, that such that at least one of a first oscillation interval and a second oscillation interval repeatedly exists, wherein an oscillation wavelength continuously and monotonically increases during the first oscillation interval, and the oscillation wavelength continuously and monotonically decreases the second oscillation interval;
 detecting an electric signal including interference waveforms, the interference waveforms being caused by the self-coupling effect of the laser light emitted from the semiconductor laser and return light from the measurement object;
 counting the number of the interference waveforms, according to the counting method of claim 3; and
 calculating a physical quantity for the measurement object based on the number of the interference waveforms.

* * * * *